United States Patent
Ryu

(10) Patent No.: US 9,269,428 B2
(45) Date of Patent: Feb. 23, 2016

(54) RRAM MEMORY DEVICE AND METHOD THEREOF

(71) Applicant: Winbond Electronics Corp., Taichung (TW)

(72) Inventor: Douk Hyoun Ryu, San Jose, CA (US)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/303,283

(22) Filed: Jun. 12, 2014

(65) Prior Publication Data

US 2015/0364186 A1    Dec. 17, 2015

(51) Int. Cl.
*G11C 5/06*        (2006.01)
*G11C 13/00*       (2006.01)
*H01L 45/00*       (2006.01)
*H01L 23/528*      (2006.01)
*H01L 27/24*       (2006.01)

(52) U.S. Cl.
CPC ............ *G11C 13/003* (2013.01); *H01L 23/528* (2013.01); *H01L 27/2436* (2013.01); *H01L 27/2463* (2013.01); *H01L 45/16* (2013.01)

(58) Field of Classification Search
CPC .... G11C 13/003; H01L 45/16; H01L 23/528; H01L 27/2436; H01L 27/2463

USPC ........................................... 365/63, 148, 49.1
See application file for complete search history.

(56) References Cited

U.S. PATENT DOCUMENTS 8,908,407 B1 * 12/2014 Haukness et al. ............ 365/49.1
2006/0209585 A1 *  9/2006 Tanizaki et al. ............... 365/148

\* cited by examiner

*Primary Examiner* — Richard Elms
*Assistant Examiner* — Mohammed A Bashar
(74) *Attorney, Agent, or Firm* — Muncy, Geissler, Olds & Lowe, P.C.

(57) ABSTRACT

A resistive random-access memory (RRAM) device and a method thereof are disclosed. The RRAM device is contains a plurality of bit cells, a plurality of word lines, a plurality of bit lines and a plurality of source lines. Each bit cell includes a transistor and resistive element, the transistor includes a gate, a source and a drain, and the resistive element is coupled to the drain of the transistor. The plurality of word lines are arranged in parallel to one another, and coupled to respective gates of the transistors. The plurality of bit lines are arranged in parallel to one another and being intersected with the plurality of word lines, and coupled to respective drains of the transistors through the resistive elements. The plurality of source lines are arranged in parallel to one another and the plurality of bit lines.

10 Claims, 3 Drawing Sheets

RRAM MEMORY DEVICE AND METHOD THEREOF

BACKGROUND OF THE INVENTION

1. Field of the Invention

The present invention relates to semiconductor circuits, and in particular relates to a resistive random-access memory (RRAM) memory device and method thereof.

2. Description of the Related Art

Integrated circuits that serve as memory devices or embedded memory devices are frequently adopted in a verity of electronics devices such as telecommunication devices, multimedia devices, computing devices, network devices, consumer devices, and others. Resistive random-access memory (RRAM) devices are a non-volatile memory device type formed using semiconductor manufacturing processes.

RRAM devices operate by a principle that a dielectric, which is normally non-conductive, can be made conductive through a filament or conduction path formed after the application of a sufficiently high voltage. The conduction path formation can arise from different mechanisms, including defects, metal migration, and other mechanisms. Various dielectric materials may be adopted in RRAM devices. The dielectric element may be reset to the non-conductive state or a high resistance state, or set to the conductive state or a low resistance state, by applying an appropriately voltage.

In the reset procedure, the RRAM devices often consume huge currents to pre-charge all bit lines, to reset certain memory cells while preventing the unintended memory cells from being reset.

Therefore, a RRAM memory device and a method thereof are provided to reduce the reset current, reduce the reset time, and increase the power efficiency of the RRAM memory device.

BRIEF SUMMARY OF THE INVENTION

A detailed description is given in the following embodiments with reference to the accompanying drawings.

An embodiment of a resistive random-access memory (RRAM) device is disclosed, comprising a plurality of bit cells, a plurality of word lines, a plurality of bit lines and a plurality of source lines. Each bit cell includes a transistor and resistive element, the transistor includes a gate, a source and a drain, and the resistive element is coupled to the drain of the transistor. The plurality of word lines are arranged in parallel to one another, and coupled to respective gates of the transistors. The plurality of bit lines are arranged in parallel to one another and being intersected with the plurality of word lines, and coupled to respective drains of the transistors through the resistive elements. The plurality of source lines are arranged in parallel to one another and the plurality of bit lines.

Another embodiment of method of forming a RRAM device is provided, comprising: providing a plurality of bit cells, each including a transistor and resistive element, wherein for each cell, the transistor includes a gate, a source and a drain, and the resistive element is coupled to the drain of the transistor; providing a plurality of word lines, arranged in parallel to one another, and coupled to respective gates of the transistors; providing a plurality of bit lines, arranged in parallel to one another and being intersected with the plurality of word lines, and coupled to respective drains of the transistors through the resistive elements; and providing a plurality of source lines, arranged in parallel to one another and the plurality of bit lines.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

As disclosed herein, an array structure of resistive random-access memory (RRAM) devices is provided. More particularly, provided is a memory array of bit cells including RRAM devices. As used herein, the term "RRAM device" or "resistive memory device" refers to a memory device that uses a switching medium whose resistance can be controlled by applying electrical signal without ferroelectricity, magnetization and phase change of the switching medium. The RRAM devices form non-volatile memory cells and thereby retain data when power is turned off. The formed resistor elements may be set or reset later by applying appropriate voltages.

Figure 1:
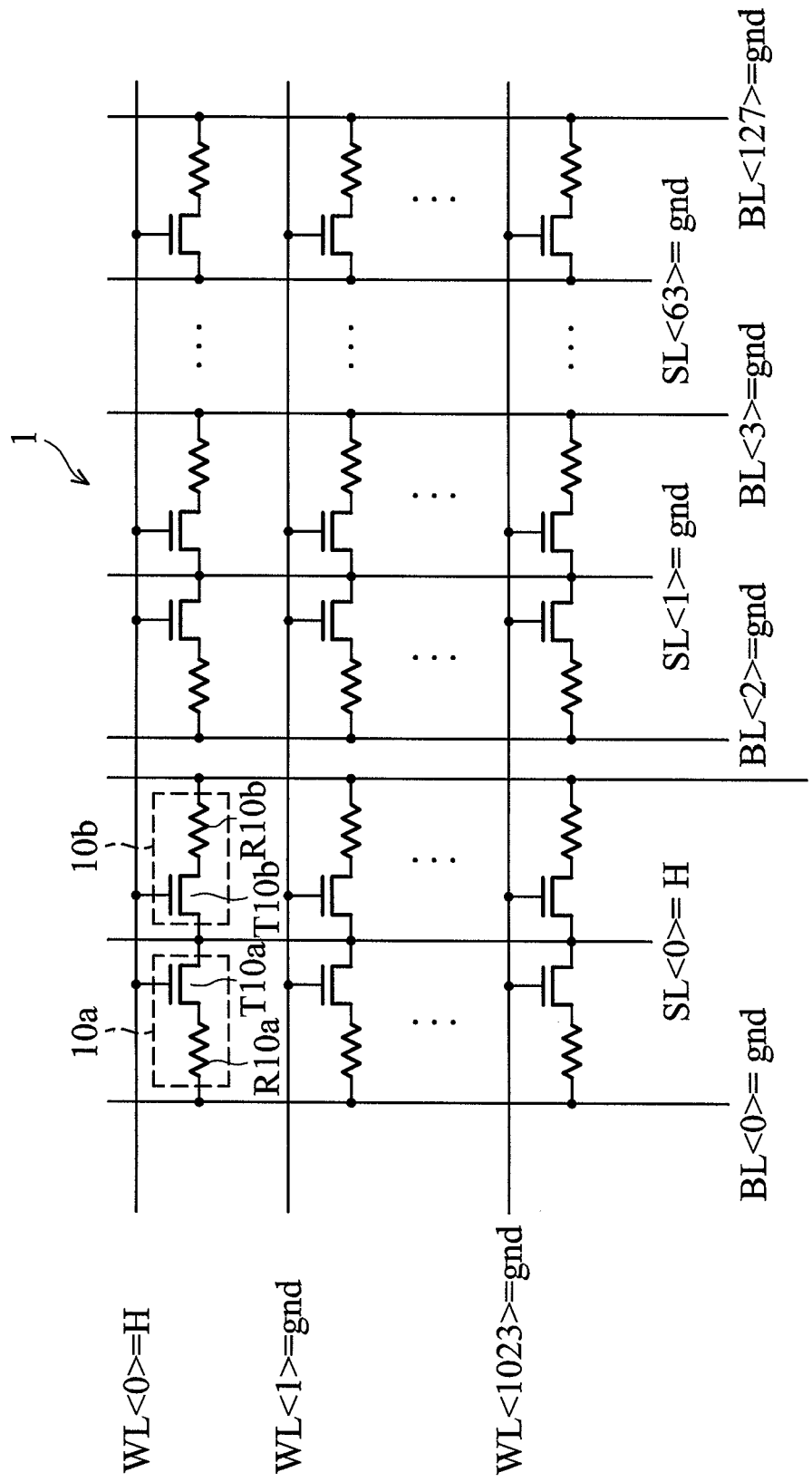
FIG. 1 is a circuit schematic of a resistive random-access memory (RRAM) device 1 according to an embodiment of the invention.

FIG. 1 is a circuit schematic of a section of a RRAM device 1 according to an embodiment of the invention, including bit cells arranged in the form of an array, word lines WL<0> through WL<1023> extending in the horizontal direction, bit lines BL<0> through BL<127> extending in the vertical direction, and source lines SL<0> through SL<63> also extending in the vertical direction. The bit lines and source lines are parallel to one another, and perpendicular to the word lines.

Each bit cell is identical to one another and contains a one transistor/one resistor (1T1R) bit cell that includes one transistor T and one resistive element R. Take a bit cell 10a in FIG. 1 as an example, the bit cell 10a contains a transistor T10a and a resistive element R10a. In each bit cell, the transistor T includes a gate coupled to one of the word lines, one of a source and a drain coupled to one of the source lines, and the other one of the source and the drain coupled to one terminal of the corresponding resistive element R of the bit cell. The other terminal of the corresponding resistive element R is coupled to one pf the bit lines. For example, for the bit cell 10a, the gate of the transistor T10a is coupled to the word line WL<0>, one of the source/drain of the transistor T10a is coupled to the source line SL<0>, the other one of the source/drain of the transistor T10a is coupled to one terminal of the resistive element R10a, and the other terminal of the resistive element R10a is coupled to the bit line BL<0>. Each bit line loading may be 250 fF.

The resistive element R is configured to store information or data therein. By addressing the transistor T via the corresponding word line WL, the information stored in the resistive element R may be read. For example, the information in the resistive element R10a may be read out to a corresponding bit line BL<0> by turning on the corresponding word line WL<0>, and the information in the resistive element R10b may be read out to a corresponding bit line BL<1> by turning on the corresponding word line WL<0>.

Each bit cell may be set or reset. The reset operation involves applying a first voltage across the resistive element R and breaking the filament or conduction path thereby restoring the resistive element R to high resistance, and the set operation involves applying a second voltage across the resistive element R and re-forming the filament or conduction path within the resistive element R, resulting in low resistance. A memory controller (not shown) can apply one of two possible logic levels to the word lines WL<0> through WL<1023>, bit lines BL<0> through BL<127> and source lines SL<0> through SL<63> to set or reset the bit cells in RRAM device 1. The two possible logic levels are logic HIGH and logic LOW. For example, the logic HIGH may be 2V and the logic LOW may be 0V. The resistive element R10a of the bit cell 10a may be reset by applying the logic HIGH to the word line WL<0> and the source line SL<0>, and applying the logic LOW to the bit line BL<0>, thereby switching the resistive element R from low to high resistance. The resistive element R10a of the bit cell 10a may be set by applying the logic HIGH to the word line WL<0> and the bit line BL<0>, and applying the logic LOW to the source line SL<0>, thereby switching the resistive element R from high to low resistance. The resistive element R10a of the bit cell 10a may remain unchanged by applying the logic LOW to the word line WL<0>, or applying the logic HIGH to the word line WL<0> while applying the same logic level (e.g., the logic HIGH or logic LOW) to the bit line BL<0> and the source line SL<0>.

Each pair of adjacent bit cells share a source line, i.e., each pair of adjacent bit cells are arranged in a mirrored position, with the opposite sources or drains of the pair of the adjacent bit cells being connected to the same source line. For example, a pair of adjacent bit cells 10a and 10b are arranged in a mirrored position, with the opposite sources/drains of transistors T10a and T10b are connected to the same source line SL<0>. The shared source lines may result in reduction in circuit area and manufacturing cost.

In one embodiment, the bit cell 10a is to be reset while the other bit cells are to be prevented from being reset. Therefore, the word line WL<0> is applied by the logic HIGH while the word lines WL<1> through WL<1023> are tied to the logic LOW, or a ground potential gnd. The bit cell 10a is reset by applying the logic HIGH to the source line SL<0> and the logic LOW to the bit line BL<0>. The adjacent bit cell 10b is prevented from being reset by applying the logic HIGH to the bit line BL<1>. In other words, in a reset operation, only a bit line connected to the adjacent bit cell of the reset bit cell is required to be pre-charged, bit lines connected to the other bit cells are not required to be pre-charged and are connected to the ground potential gnd. As a consequence, the bit line charging time and current can be reduced, leading to a reduced reset time and increased power efficiency.

Further, because each pair of bit cells are controlled by different source lines, a set operation and a reset operation can be concurrently applied to the bit cells in different pairs of bit cells.

Although the circuit schematic in FIG. 1 shows the word lines WL extend along the horizontal direction and the bit lines BL and source lines SL extend along the horizontal direction, people skilled in the art should recognize that the directions are just reference relative to each other, and the bit lines BL and source lines SL may be positioned in a number of different orientations that are substantially orthogonal to the word lines WL. The direction reference in FIG. 1 is used for purposes of illustration and is in no way limiting the invention.

Figure 2:
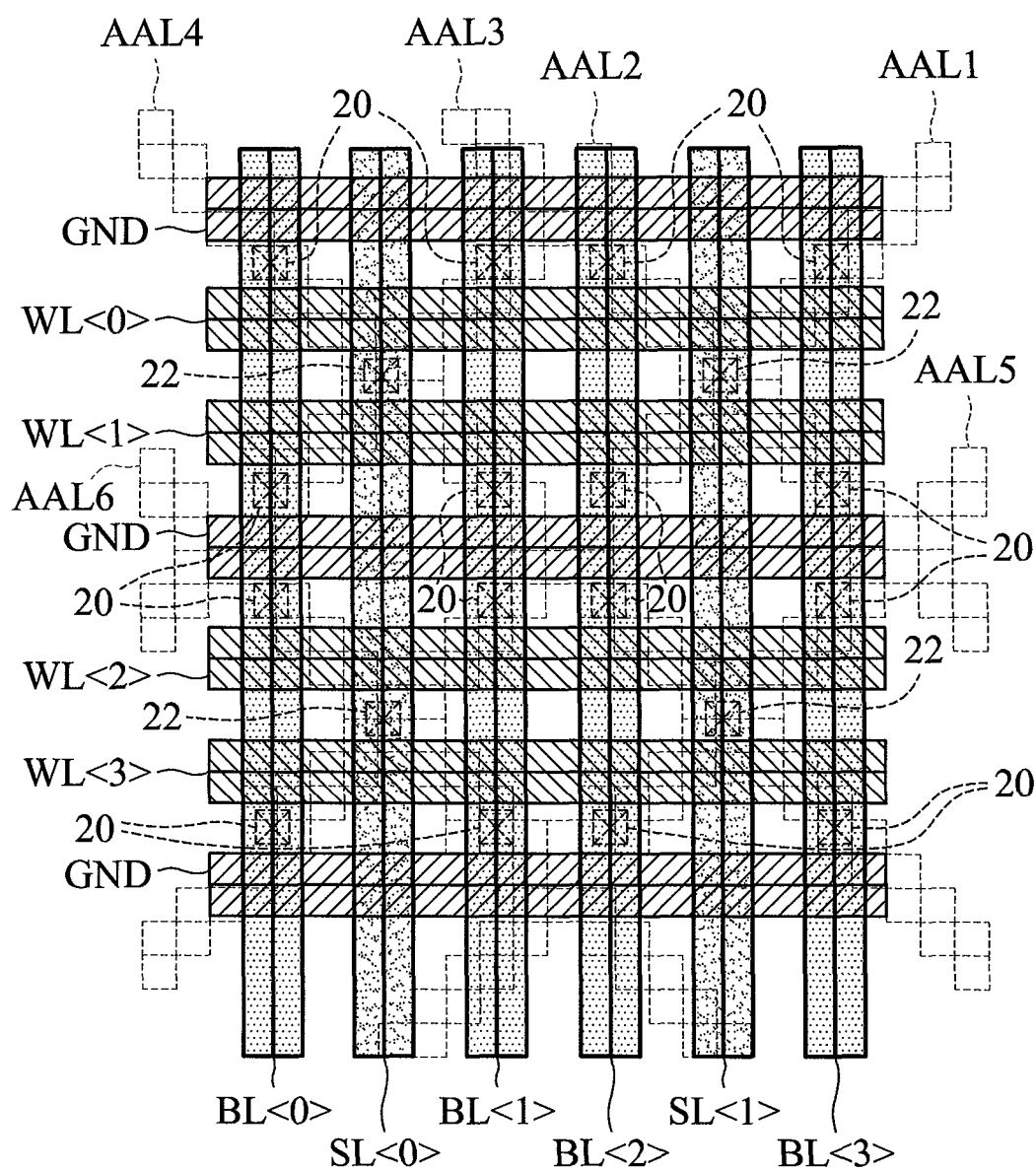
FIG. 2 is a layout diagram of a RRAM device 2 according to an embodiment of the invention.

Turning to FIG. 2, which shows a layout diagram of the RRAM device 1 according to an embodiment of the invention. As illustrated in FIG. 2, the RRAM device 1 includes a bit cell array containing bit cells 20, bit lines BL<0> through BL<3> and source lines SL<0> and SL<1> running along the vertical direction, word lines WL<0> through WL<3> running along the horizontal direction substantially perpendicular to the bit lines BL and the source lines SL, active area segments AAL1 through AAL6 running along a diagonal direction, and source line contacts 22. The portions in which the transistors gates are formed generally are denoted at intersections of the active area segments AAL1 through AAL6 and the word lines WL<0> through WL<3>.

The bit cells 20 are disposed at intersections of the active area segments AAL1 through AAL6 and the bit lines BL<0> through BL<3>. The adjacent bit cells 20 are arranged in columns extending in the vertical direction. Each bit cell includes a transistor T (not shown) and a resistive element R (not shown) connected thereto. Depending on voltage being applied across the resistive element R, the bit cell 20 may be "set" or "reset". By addressing the transistor T via the corresponding word line WL, the information stored in the resistive element R may be read. For example, the information may be read out to a corresponding bit line BL.

Each pair of adjacent bit cells share a common source line SL. For example, the adjacent bit cells 20 on the bit lines BL<3> and BL<2> share the common source line SL<1>, the adjacent bit cells 20 on the bit lines BL<1> and BL<0> share the common source line SL<0>.

The source line contacts 22 are disposed at intersections of the active area segments AAL1 through AAL6 and the source lines SL<0> and SL<1>. The source line contacts 22 are also arranged in columns extending in the vertical direction.

The word lines WL<0> through WL<3> are substantially orthogonal to the bit lines BL<0> through BL<3> and the source lines SL<0> and SL<1>, and may be disposed at a regular or irregular distance from one another.

The active area segments AAL1 through AAL6 are formed in the X-shaped running across the both the top-left to the bottom-right and the top-right to the bottom-left direction. Further, the active area segments AAL may form an angle ranging from 15 to 45 degrees to the bit lines BL and the source lines SL (angled active lines). For example, the active area segments AAL1 through AAL6 may form an angle of 40 degrees to the bit lines BL and the source lines SL. The angled active area segments AAL allow the bit lines BL and the source lines SL to be disposed in parallel to one another. The X-shaped angled active area segments AAL allow the word lines WL to be perpendicular to the bit lines BL and the source lines SL.

In some embodiments, angled bit lines BL, source lines SL, and word lines WL may be implemented. For example, the angled word lines WL may be arranged to be substantially 90 degree across the angled active area segments AAL.

The RRAM device 1 in FIGS. 1 and 2 employ source lines which are parallel to the bit lines and perpendicular to the word lines, being prevented from consuming excessive current to pre-charge the bit lines in the reset operation, resulting in a reduced reset time and increased power efficiency for the RRAM device.

Figure 3:
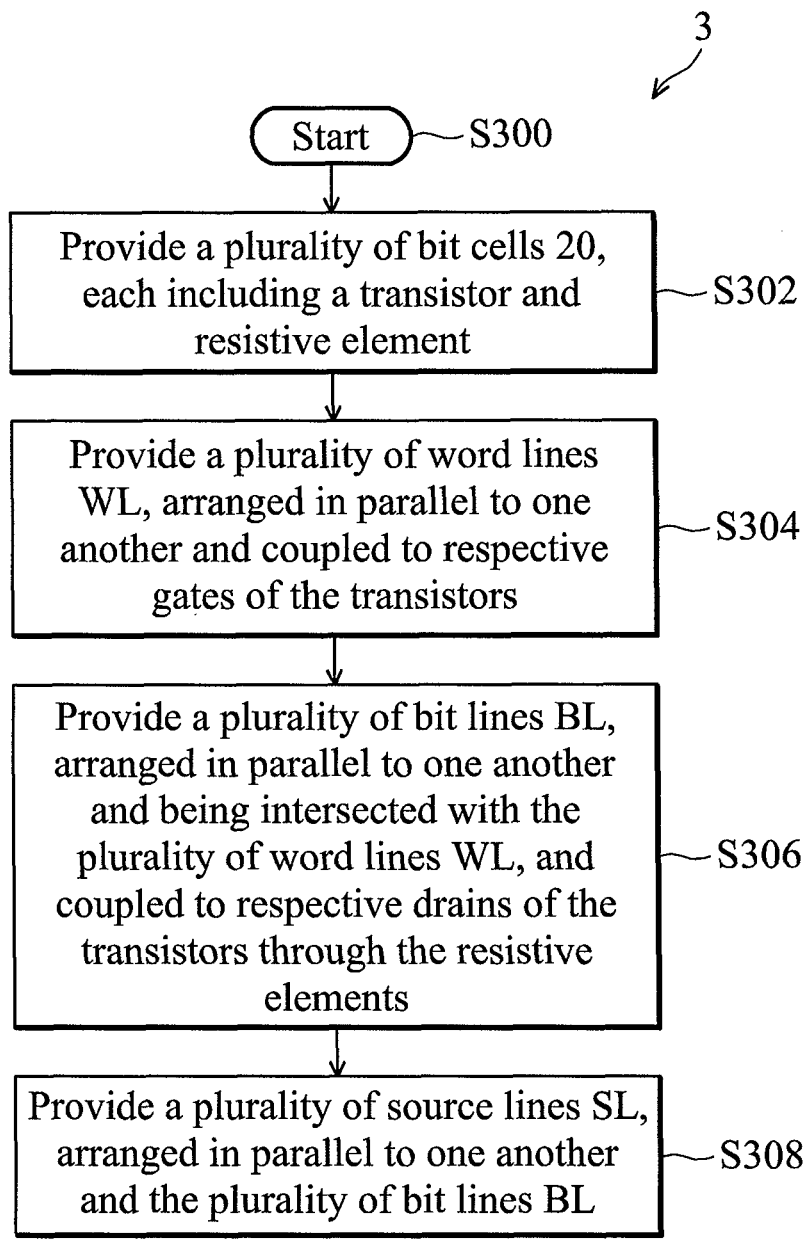
FIG. 3 is a flowchart of a method 3, forming a RRAM device according to an embodiment of the invention.

FIG. 3 is a flowchart of a method 3, forming the RRAM device 1 in FIGS. 1 and 2 according to an embodiment of the invention. The following uses the RRAM device 1 in FIG. 2 as an example to explain the method 3 in detail.

Upon startup, the method 3 provides a plurality of bit cells 20 on a semiconductor substrate (S302). Each bit cell 20 includes a transistor T and resistive element R. The transistor T includes a source, drain, and gate electrode. The resistive element R includes 2 terminals, and the resistance thereof can be adapted by applying different voltages there across.

Next, the method 3 provides a plurality of word lines WL arranged in parallel to one another. Each word line WL is coupled to respective the gate electrodes of the transistors T of the bit cells 20 (S304). The gate electrode is electrically isolated from a channel connecting the respective source and drain electrodes by a gate dielectric. The gate electrode may form part of a word line WL or may be formed as an isolated gate electrode which is connected with a corresponding word line WL.

The method 3 provides a plurality of bit lines BL arranged in parallel to one another and being intersected with the plurality of word lines WL. Each bit line BL is coupled to a respective drain of the transistors T through the resistive elements R of the bit cell 20 (S306). In some implementations, the plurality of bit lines BL are substantially perpendicular to the plurality of word lines WL. In other implementations, the plurality of bit lines BL are in an angle less than 90 degree from the plurality of word lines WL. The bit cells 20 are formed at the intersection of the plurality of bit lines BL and the active area segments AAL, which run diagonally through the RRAM device 1. The active area segments AAL may be arranged in an angle between 15 to 45 degrees from the bit lines BL.

The method 3 then provides a plurality of source lines SL arranged in parallel to one another and in parallel to the plurality of bit lines BL (S308). Each source line SL is coupled to a respective source electrode of the transistor T of the bit cell 20. Further, each source line SL may be shared by a pair of adjacent bit cells 20. In some implementations, the plurality of source lines SL are substantially perpendicular to the plurality of word lines WL. In other implementations, the source lines SL are in an angle less than 90 degree from the plurality of word lines WL. The source line contacts 22 are formed at the intersection of the plurality of source lines SL and the active area segments AAL.

In the reset operation, since each source line SL is disposed in parallel with the bit lines BL, not all bit lines are required to be pre-charged. As a result, the reset operation adopting the RRAM device 1 of the embodiments requires reduced reset current and causes reduced reset time. Further, based on the circuit arrangement of the embodiments, the RRAM device 1 can perform the set and reset operations concurrently for two or more bit cells 20.

The method 3 is then completed and exited.

The method 3 adopts the RRAM device which includes source lines that are parallel to the bit lines and perpendicular to the word lines, thereby being prevented from consuming excessive current to pre-charge the bit lines in the reset operation, resulting in a reduced reset time and increased power efficiency for the RRAM device.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The term "or" used herein is intended to mean an inclusive "or" rather than an exclusive "or." That is, unless specified otherwise, or clear from the context, the phrase "X employs A or B" is intended to mean any of the natural inclusive permutations. In addition, the articles "a" and "an" as used in this application and the appended claims should generally be construed to mean "one or more" unless specified otherwise or clear from the context to be directed to a singular form.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random-access memory (RRAM) device, comprising:
    a plurality of bit cells, each including a transistor and resistive element, wherein for each cell, the transistor includes a gate, a source and a drain, and the resistive element is coupled to the drain of the transistor;
    a plurality of word lines, arranged in parallel to one another, and coupled to respective gates of the transistors;
    a plurality of bit lines, arranged in parallel to one another and being intersected with the plurality of word lines, and coupled to respective drains of the transistors through the resistive elements; and
    a plurality of source lines, arranged in parallel to one another and the plurality of bit lines;
    wherein each source line is coupled to respective sources of the transistors of two adjacent bit cells of the plurality of bit cells; and
    wherein when a first bit cell adjacent to a second bit cell of the plurality of bit cells is reset, only a second bit line connected to a second drain of the transistor of the second bit cell is pre-charged to a "HIGH" voltage.

2. The RRAM device of claim 1, wherein when a first bit cell adjacent to a second bit cell of the plurality of bit cells is reset, a third bit cell other than the first and second bit cells is set concurrently.

3. The RRAM device of claim 1, further comprising:
    a plurality of angled active lines, arranged to intersect with the plurality of bit lines and the plurality of source lines, wherein the plurality of bit cells are formed at first intersections of the plurality of angled active lines and the plurality of bit lines; and
    a plurality of source line connections, disposed at second intersections of the plurality of angled active lines and the plurality of source lines.

4. The RRAM device of claim 3, wherein the plurality of word lines are substantially perpendicular to the plurality of angled active lines.

5. The RRAM device of claim 1, wherein the plurality of word lines are substantially perpendicular to the plurality of bit lines and the plurality of source lines.

6. A method of forming a RRAM device, comprising:
providing a plurality of bit cells, each including a transistor and resistive element, wherein for each cell, the transistor includes a gate, a source and a drain, and the resistive element is coupled to the drain of the transistor;
providing a plurality of word lines, arranged in parallel to one another, and coupled to respective gates of the transistors;
providing a plurality of bit lines, arranged in parallel to one another and being intersected with the plurality of word lines, and coupled to respective drains of the transistors through the resistive elements; and
providing a plurality of source lines, arranged in parallel to one another and the plurality of bit lines;
wherein each source line is coupled to respective sources of the transistors of two adjacent bit cells of the plurality of bit cells;
wherein the method further comprises, when a first bit cell adjacent to a second bit cell of the plurality of bit cells is reset, pre-charging only a second bit line connected to a second drain of the transistor of the second bit cell to a "HIGH" voltage.

7. The method of claim 6, further comprising:
resetting a first bit cell adjacent to a second bit cell of the plurality of bit cells and setting a third bit cell other than the first and second bit cells concurrently.

8. The method of claim 6, further comprising:
providing a plurality of angled active lines, arranged to intersect with the plurality of bit lines and the plurality of source lines,
forming the plurality of bit cells at first intersections of the plurality of angled active lines and the plurality of bit lines; and
forming a plurality of source line connections at second intersections of the plurality of angled active lines and the plurality of source lines.

9. The method of claim 8, wherein the plurality of word lines are substantially perpendicular to the plurality of angled active lines.

10. The method of claim 6, wherein the plurality of word lines are substantially perpendicular to the plurality of bit lines and the plurality of source lines.

* * * * *